(12) United States Patent
Ito

(10) Patent No.: US 9,638,914 B2
(45) Date of Patent: May 2, 2017

(54) ELECTROOPTICAL APPARATUS, PRODUCTION METHOD FOR THE ELECTROOPTICAL APPARATUS, AND ELECTRONIC APPLIANCE

(71) Applicant: SEIKO EPSON CORPORATION, Tokyo (JP)

(72) Inventor: Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/059,757

(22) Filed: Mar. 3, 2016

(65) Prior Publication Data
US 2016/0291321 A1 Oct. 6, 2016

(30) Foreign Application Priority Data
Apr. 1, 2015 (JP) ................. 2015-074870

(51) Int. Cl.
*G02B 26/08* (2006.01)
*B81B 3/00* (2006.01)

(52) U.S. Cl.
CPC .......... *G02B 26/0841* (2013.01); *B81B 3/00* (2013.01); *G02B 26/0833* (2013.01)

(58) Field of Classification Search
CPC .................. G02B 26/0833; G02B 26/0841
USPC ....... 359/223.1, 224.1, 225.1, 295, 298, 318
See application file for complete search history.

(56) References Cited

U.S. PATENT DOCUMENTS

| 5,631,782 | A | 5/1997 | Smith et al. | |
| 5,650,881 | A * | 7/1997 | Hornbeck | B81B 3/0072 |
| | | | | 348/771 |
| 5,703,728 | A | 12/1997 | Smith et al. | |
| 6,861,277 | B1 | 3/2005 | Monroe et al. | |
| 2005/0106772 | A1 | 5/2005 | Monroe et al. | |
| 2005/0146771 | A1* | 7/2005 | Shih | G02B 26/0841 |
| | | | | 359/291 |
| 2007/0019280 | A1 | 1/2007 | Sasagawa et al. | |
| 2007/0019922 | A1 | 1/2007 | Sasagawa et al. | |
| 2007/0153359 | A1* | 7/2007 | Bryant | G02B 26/0833 |
| | | | | 359/291 |
| 2008/0220552 | A1 | 9/2008 | Pan | |
| 2008/0297874 | A1 | 12/2008 | Pan | |
| 2016/0291317 | A1* | 10/2016 | Ito | G02B 26/0833 |
| 2016/0291318 | A1* | 10/2016 | Ito | G02B 26/0833 |
| 2016/0291319 | A1* | 10/2016 | Ito | G02B 26/0841 |

(Continued)

FOREIGN PATENT DOCUMENTS

| JP | H08-227042 A | 9/1996 |
| JP | 2005-115370 A | 4/2005 |

(Continued)

*Primary Examiner* — Ricky D Shafer
(74) *Attorney, Agent, or Firm* — Oliff PLC

(57) ABSTRACT

An electrooptical apparatus includes a torsion hinge (torsion hinge) that has a first opening portion. Around the first opening portion, the opposite side of the torsion hinge to a substrate is in contact with a first connecting portion of a mirror support post that has a tubular shape. A resin that constitutes a sacrificial layer does not remain within the mirror support post. A second end portion of the mirror support post which is at a side opposite the substrate forms a flat plate portion. The second end portion is in contact with a mirror. Therefore, the surface of the mirror does not have any dimple.

10 Claims, 9 Drawing Sheets

(56) References Cited

U.S. PATENT DOCUMENTS

2016/0291320 A1* 10/2016 Momose ............ G02B 26/0841
2016/0291322 A1* 10/2016 Ito ..................... G02B 26/0841

FOREIGN PATENT DOCUMENTS

| JP | 2007-510174 A | 4/2007 |
| JP | 2009-503566 A | 1/2009 |
| JP | 2011-138888 A | 7/2011 |
| WO | 2011-080883 A1 | 7/2011 |

* cited by examiner

ST1, ST2

ST3

ST4

ST5

ST6

ST7

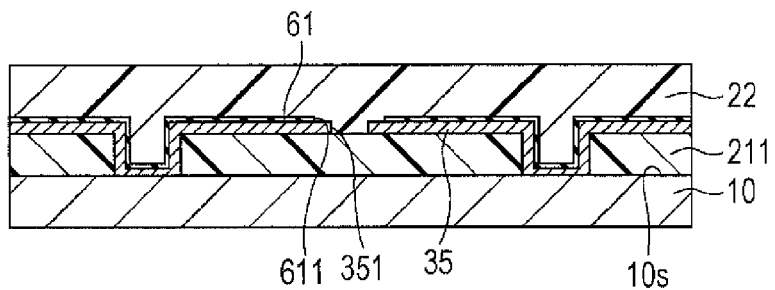
FIG. 6A ST8
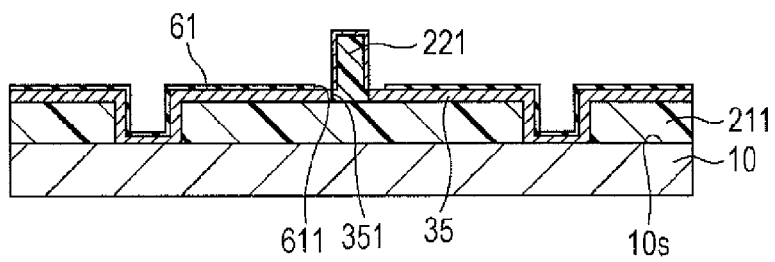
FIG. 6B ST9
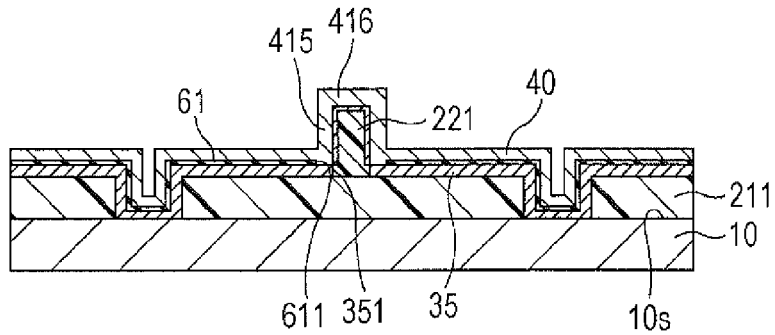
FIG. 6C ST10
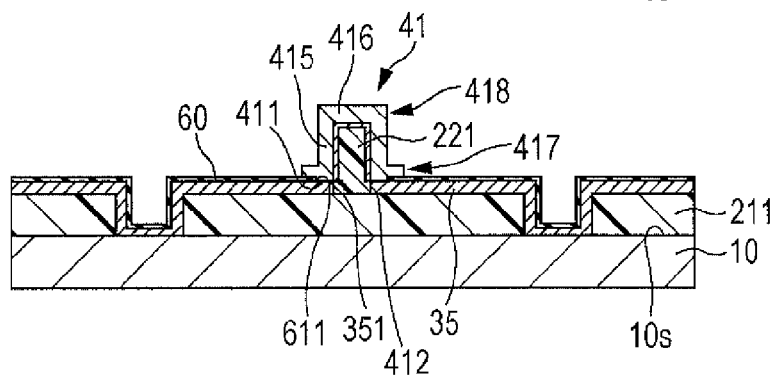
FIG. 6D ST11
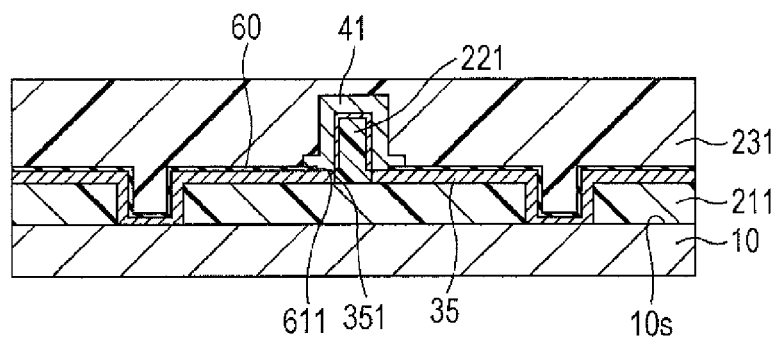
FIG. 6E ST12

ST13

ST14, ST15

ST16, ST17

ST18

ST3

ST4

ST5

ST6

ST7

ST9

ST11

ST15

ST13

ST16

ELECTROOPTICAL APPARATUS, PRODUCTION METHOD FOR THE ELECTROOPTICAL APPARATUS, AND ELECTRONIC APPLIANCE

CROSS REFERENCE

The entire disclosure of Japanese Patent Application No. 2015-074870, filed Apr. 1, 2015, is expressly incorporated by reference herein.

BACKGROUND

1. Technical Field

The present invention relates to an electrooptical apparatus that includes a mirror, a production method for the electrooptical apparatus, and an electronic appliance.

2. Related Art

As electronic appliances, for example, projection type display apparatuses that modulate light emitted from a light source using a plurality of mirrors (micro mirrors) of an electrooptical apparatus called DMD (digital mirror device) and perform magnifying projection of the modulated light using a projection optical system so as to display images on a screen are known. In the electrooptical apparatus used in such an electronic appliance, the mirrors are supported on torsion hinges (twist hinges) via mirror support posts and are electrically connected to the torsion hinges. Besides, the torsion hinges (twist hinges) are supported by substrate-side bias electrodes formed on a substrate with the hinge support posts interposed therebetween, and are also electrically connected to the substrate-side bias electrodes. Therefore, by applying a bias voltage from a substrate-side bias electrode to a corresponding one of the mirrors and applying a drive voltage to an address electrode, the mirror can be driven due to electrostatic force created between the mirror and the address electrode. In a production process for an electrooptical apparatus having such a construction, torsion hinges (twist hinges), mirrors, and the like are formed by using a sacrificial layer made of a resin material.

On another hand, for formation of a mirror support post, JP-A-8-227042 proposes a construction in which a metal layer is formed on a surface of a columnar sacrificial layer left on a torsion hinge (twist hinge).

However, if a mirror support post is formed by stacking a metal layer using a columnar sacrificial layer, there is a risk that a gas may be produced from the sacrificial layer when the temperature of the electrooptical apparatus rises because of emitted light or heat generation of the substrate or the like at the time of operating a drive circuit. Such a gas, if it adheres to the surface (reflecting surface) of a mirror, degrades the reflectance of the mirror, and is therefore not preferable.

SUMMARY

An advantage of some aspects of the invention is that an electrooptical apparatus can be formed without a sacrificial layer remaining on mirror support post that support mirror. Furthermore, a production method for the electrooptical apparatus and an electronic appliance that includes the electrooptical apparatus can be provided.

An electrooptical apparatus according to one aspect of the invention includes a substrate, a metal layer that includes a first support post (hinge support post) that is provided at a one surface side of the substrate and that is protruded toward the substrate and that is supported by the substrate and a torsion hinge (twist hinge) that has a first opening portion, an electroconductive second support post (mirror support post) that is protruded from the torsion hinge (twist hinge) toward a side opposite the substrate and has a tubular shape and that has a first end portion that has an open end whose opening faces a substrate side, the first end portion having a first connecting portion that contacts, around the first opening portion of the torsion hinge (twist hinge), the twist hinge from the side opposite the substrate, and a mirror that contacts a second end portion of the second support post (mirror support post) which is at the side opposite the substrate. The second support post (mirror support post) further has a second connecting portion that contacts an inner surface of the first opening portion.

In the invention, the second support post (mirror support post) protruded from the torsion hinge (twist hinge) toward the side opposite the substrate has a tubular shape. Furthermore, the substrate-side first end portion of the second support post (mirror support post) is an open end. The torsion hinge (twist hinge) is provided with the first opening portion. Therefore, even if a sacrificial layer is present inside when the second support post (mirror support post) is formed, the sacrificial layer can be removed. Hence, the resin that forms the sacrificial layer does not remain within the mirror support post, so that even when the temperature of the electrooptical apparatus rises due to emitted light or due to heat generation of the substrate or the like at the time of operation of the drive circuit, production of gas from a sacrificial layer does not occur. Consequently, an event in which gas produced from a sacrificial layer decreases the reflectance of the surface of a mirror (reflecting surface thereof) will not occur. Furthermore, on the opposite side of the second support post (mirror support post) to the substrate, a mirror separate from the second support post (mirror support post) can be connected to the second support post (mirror support post) when the second end portion is provided as a flat portion. Therefore, no dimple is formed on the surface of the mirror. Hence, light utilization efficiency can be improved and the decrease in contrast level due to the scattering by the mirror can be restrained.

The foregoing electrooptical apparatus according to the invention may further include an insulating intermediate layer that is provided between the torsion hinge (twist hinge) and the second support post (mirror support post) and that has a second opening portion inside which the first connecting portion is located.

Furthermore, when a thickness of a thinnest portion of the first connecting portion is represented by dm and a distance from an inner peripheral surface of the first opening portion of the torsion hinge (twist hinge) to an inner peripheral surface of the second opening portion of the intermediate layer is represented by dc, the thickness dm and the distance dc may satisfy a relationship as follows:

$$dm < dc$$

Still further, when a width of a portion of the intermediate layer which is located between the torsion hinge (twist hinge) and the second support post (mirror support post) is represented by ds, a thickness of a thinnest portion of the first connecting portion is represented by dm, and a distance from an inner peripheral surface of the first opening portion of the torsion hinge (twist hinge) to an inner peripheral surface of the second opening portion of the intermediate layer is represented by dc, the width ds, the thickness dm, and the distance do may satisfy a relationship as follows:

$$dm < ds < dc$$

Furthermore, when a wall thickness of a tube portion of the second support post (mirror support post) which extends from the torsion hinge (twist hinge) toward the mirror is represented by dp, a width of a portion of the intermediate layer which is located between the torsion hinge (twist hinge) and the second support post (mirror support post) is represented by ds, and a distance from an inner peripheral surface of the first opening portion of the torsion hinge (twist hinge) to an inner peripheral surface of the second opening portion of the intermediate layer is represented by dc, the wall thickness dp, the width ds, and the distance do may satisfy a relationship as follows:

$ds < dp$ and $dc < dp$

A production method for an electrooptical apparatus according to another aspect of the invention includes a first sacrificial layer-forming step of forming, at a one surface side of a substrate, a first sacrificial layer that has a first support post-dedicated opening portion, a first electroconductive film-forming step of forming a first electroconductive film at an opposite side of the first sacrificial layer to the substrate and inside the first support post-dedicated opening portion, a first patterning step of forming a torsion hinge (twist hinge) that has a first opening portion and that has a first support post (hinge support post) that is formed by the first electroconductive film accumulated inside the first support post-dedicated opening portion, by patterning the first electroconductive film, a second sacrificial layer-forming step of forming a columnar second sacrificial layer that is provided on an opposite side of the torsion hinges (twist hinges) to the substrate and that coincides with the first opening portion and that has an outside diameter that is smaller than an inside diameter of the first opening portion, a second electroconductive film-forming step of forming a second electroconductive film that covers the opposite side of the torsion hinge (twist hinge) to the substrate and that includes a tube portion that covers a side surface of the columnar second sacrificial layer and a flat plate portion that covers an end surface at an opposite side of the columnar second sacrificial layer to the substrate, a second patterning step of forming a second support post (mirror support post) having a first connecting portion that covers the columnar second sacrificial layer and that contacts, around the columnar second sacrificial layer, the torsion hinge (twist hinge) from a side opposite the substrate and a second connecting portion that contacts an inner peripheral surface of the first opening portion of the torsion hinge (twist hinge), by patterning the second electroconductive film, a third sacrificial layer-forming step of forming a third sacrificial layer that covers the torsion hinge (twist hinge) and the second support post (mirror support post) from the side opposite the substrate, a planarizing step of making the second support post (mirror support post) bare by planarizing the third sacrificial layer from the side opposite the substrate, a third electroconductive film-forming step of forming a third electroconductive film on an opposite side of the third sacrificial layer to the substrate, a third patterning step of forming a mirror by patterning the third electroconductive film, and a sacrificial layer-removing step of removing the first sacrificial layer, the second sacrificial layer, and the third sacrificial layer.

In the foregoing electrooptical apparatus production method according to the invention, in the planarizing step, the flat plate portion of the second electroconductive film may be made bare.

In the foregoing electrooptical apparatus production method according to the invention, at a time after the first electroconductive film-forming step and before the first patterning step, an insulating etching mask layer identical in planar shape to the torsion hinge (twist hinge) may be provided on an opposite side surface of the first electroconductive film to the substrate. Furthermore, in the first patterning step, the first electroconductive film may be patterned using the etching mask layer as a mask. After the first patterning step, a second opening portion through which a portion of the torsion hinge (twist hinge) which extends along an edge of the first opening portion is bare, without being covered with the etching mask layer, may be formed by patterning the etching mask layer.

The electrooptical apparatus according to the invention can be used in various electronic appliances. In such cases, the electronic appliance is provided with a light source unit that emits light source light to the mirror. Furthermore, in the case where such an electronic appliance is a projection type display apparatus or a head-mounted display apparatus, the electronic appliance is further equipped with a projection optical system that projects light modulated by the mirror.

BRIEF DESCRIPTION OF THE DRAWINGS

The invention will be described with reference to the accompanying drawings, wherein like numbers reference like elements.

FIGS. 6A to 6E are sectional views illustrating steps of a production method for an electrooptical apparatus according to the invention.

DESCRIPTION OF EXEMPLARY EMBODIMENTS

Figure 1:
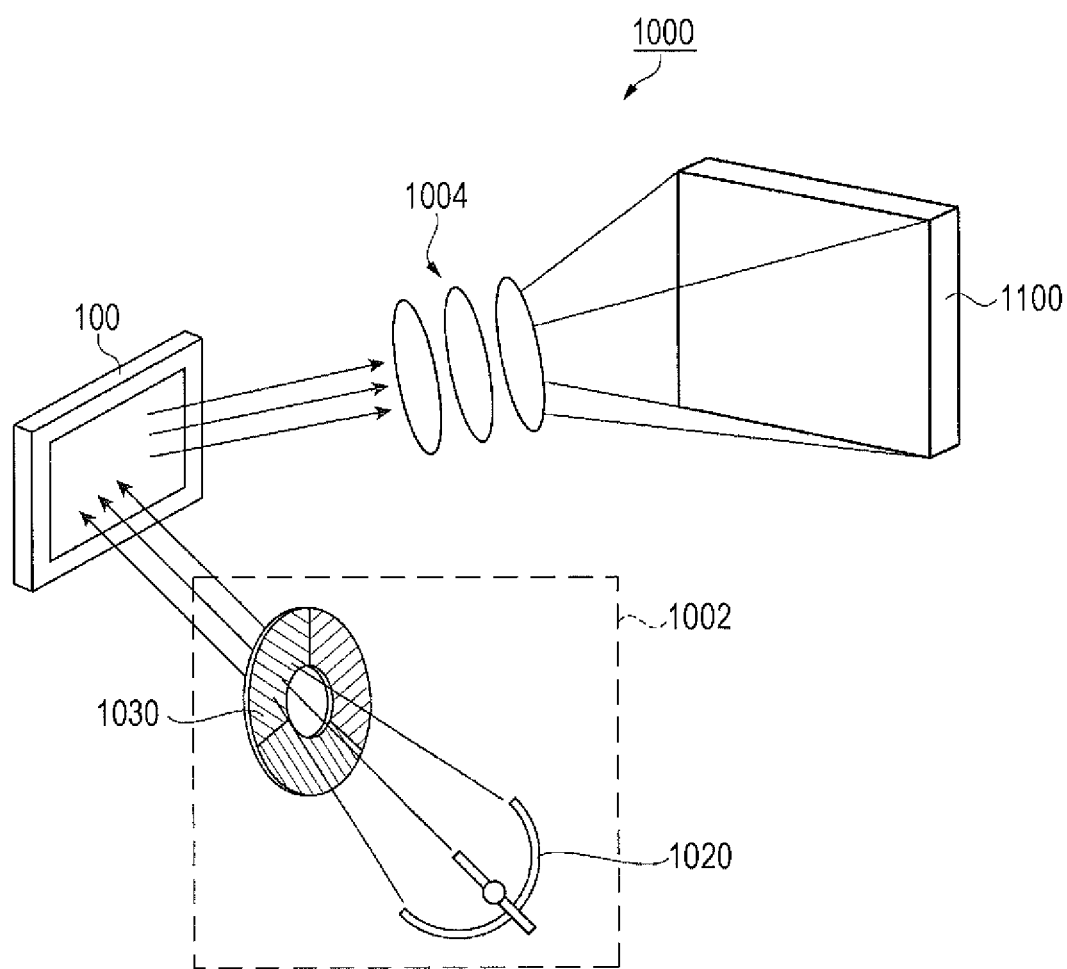
FIG. 1 is a schematic diagram showing an optical system of a projection type display apparatus as an electronic appliance to which the invention has been applied.

Exemplary embodiments of the invention will be described with reference to the accompanying drawings. In the following description, a projection type display apparatus will be described as an electronic appliance according to the invention. In the drawings that will be referred to in the following description, various layers and members are shown on different scales so that the sizes of the layers and the members in the drawings allow easy recognition of the layers and the members. Besides, the numbers of mirrors and the like shown in the drawings are less than the actual numbers thereof.

Projection Type Display Apparatus as Electronic Appliance

FIG. 1 is a schematic diagram showing an optical system of a projection type display apparatus as an electronic appliance according to the invention. A projection type display apparatus 1000 shown in FIG. 1 includes a light source unit 1002, an electrooptical apparatus 100 that, according to image information, modulates light emitted from the light source unit 1002, and a projection optical system 1004 that projects light modulated by the electrooptical apparatus 100 as a projected image onto a projection target 1100 such as a screen. The light source unit 1002 includes a light source 1020 and a color filter 1030. The light source 1020 emits white light and the color filter 1030, as it rotates, emits light of various colors. The electrooptical apparatus 100 modulates incident light at timing synchronized with the rotation of the color filter 1030. Note that, instead of the color filter 1030, a phosphor substrate that converts light emitted from the light source 1020 into light of various colors may be used. Furthermore, light source units 1002 and electrooptical apparatuses 100 may be provided separately for light of each color.

Basic Construction of Electrooptical Apparatus 100

Figure 2A:
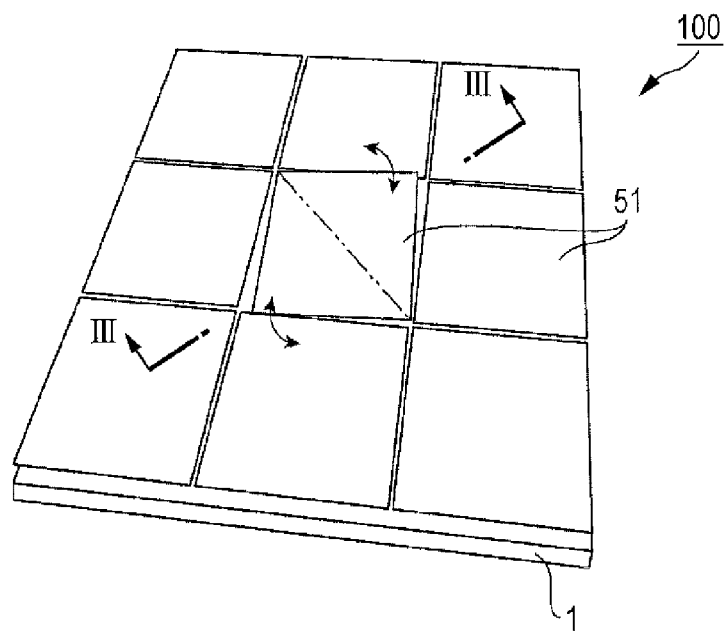
FIGS. 2A and 2B are illustrative diagrams schematically showing a basis construction of an electrooptical apparatus to which the invention has been applied.
Figure 2B:
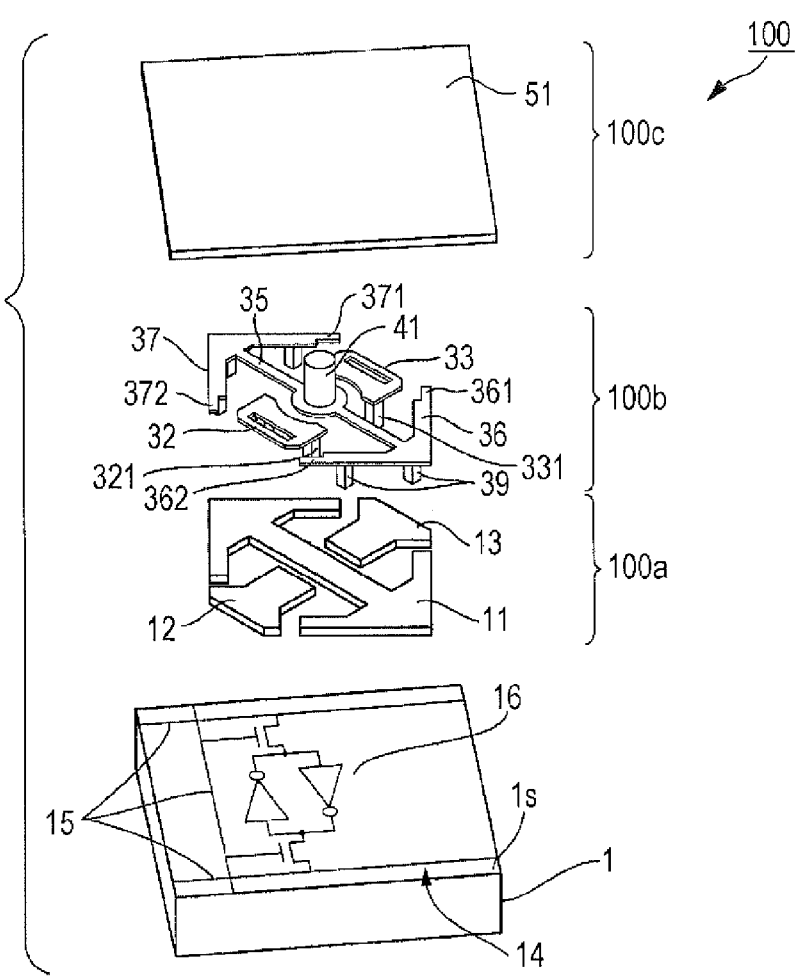
Figure 3A:
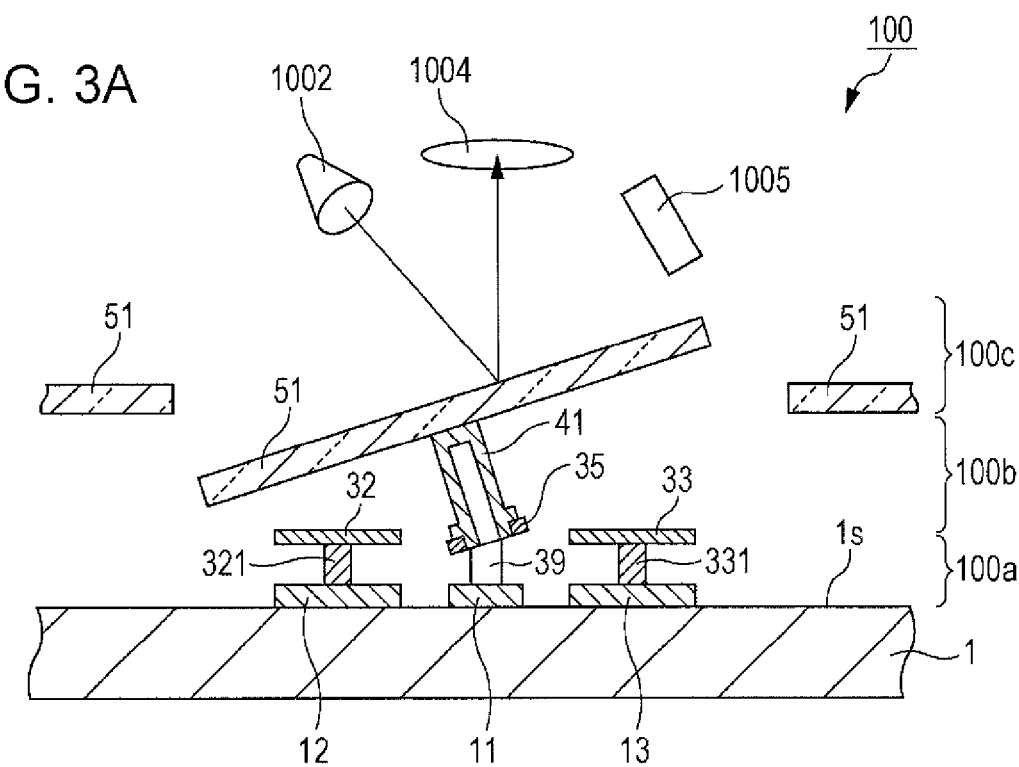
FIGS. 3A and 3B are illustrative diagrams schematically showing sectional views of portions of the electrooptical apparatus according to the invention, the sectional views being taken on line in FIG. 2A.
Figure 3B:
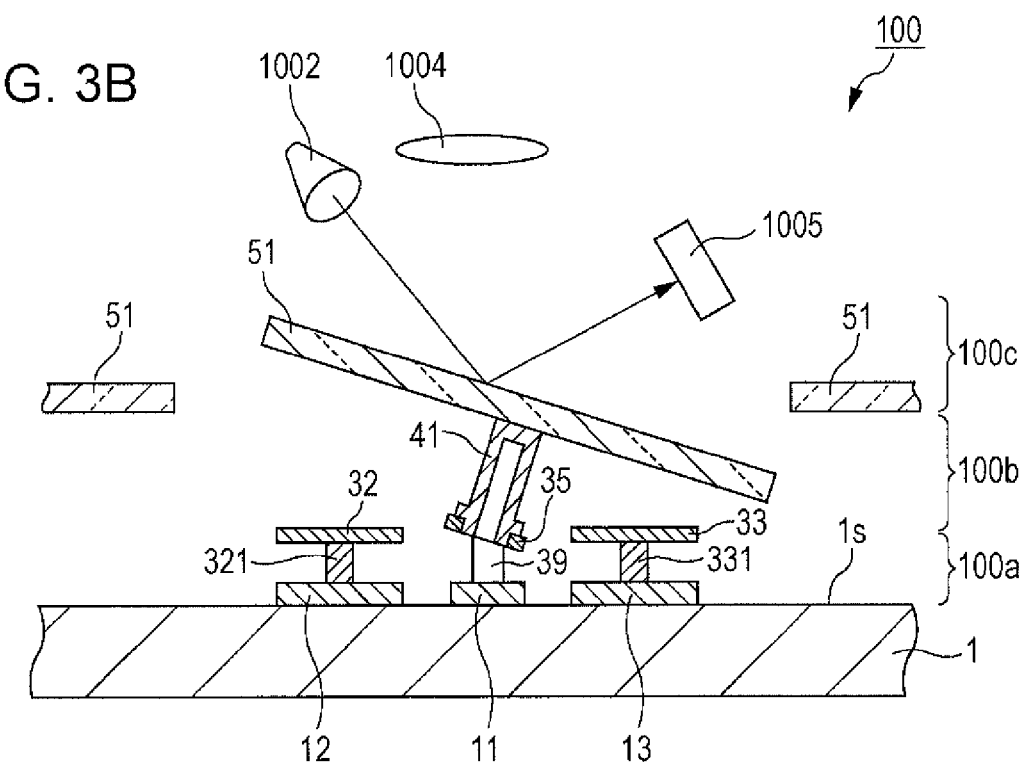

FIGS. 2A and 2B schematically illustrate a basic construction of the electrooptical apparatus 100 according to the invention. FIG. 2A is an illustrative diagram showing portions of the electrooptical apparatus 100. FIG. 2B is an exploded perspective view of portions of the electrooptical apparatus 100. FIGS. 3A and 3B are illustrative diagrams schematically showing sectional views of portions of the electrooptical apparatus 100 according to the invention taken on line III-III in FIG. 2A. FIG. 3A schematically shows a state in which a mirror is tilted to one side, and FIG. 3B schematically shows a state in which the mirror is tilted to another side.

As shown in FIGS. 2A and 2B and FIGS. 3A and 3B, the electrooptical apparatus 100 includes a plurality of mirrors 51 disposed in a matrix arrangement on a one-side surface is of a substrate 1. The mirrors 51 are apart from the substrate 1. The substrate 1 is, for example, a silicon substrate. Each mirror 51 is, for example, a micro mirror having a planar shape a side of which has a length of 10 to 30 μm. The mirrors 51 are disposed in, for example, an arrangement of 600×800 to 1920×1080, and one mirror 51 corresponds to one pixel.

A surface of each mirror 51 is a reflecting surface made of a reflecting metal film such as an aluminum film. The electrooptical apparatus 100 has a first-tier portion 100a that includes substrate-side bias electrodes 11, substrate-side address electrodes 12 and 13, etc. that are formed on the one-side surface 1s of the substrate 1, a second-tier portion 100b that includes elevated address electrodes 32 and 33 and torsion hinge (twist hinge) 35, and a third-tire portion 100c that includes the mirrors 51. In the first-tier portion 100a, an address circuit 14 is formed on the substrate 1. The address circuit 14 includes wirings 15, such as work lines and bit lines, and memory cells for selectively controlling operations of the individual mirrors 51, and has a circuit configuration that includes CMOS (complementary metal oxide semiconductor) circuits 16 and that is similar to that of a RAM (random access memory).

The second-tier portion 100b includes the elevated address electrodes 32 and 33, the torsion hinge 35, and mirror support post (second support post) 41. The elevated address electrodes 32 and 33 are electrically connected to the substrate-side address electrodes 12 and 13 via address electrode support posts 321 and 331 and are supported by the substrate-side address electrodes 12 and 13. Hinge arms 36 and 37 extend from two opposite ends of each torsion hinge 35. The hinge arms 36 and 37 of each torsion hinge 35 are electrically connected to a corresponding one of the substrate-side bias electrodes 11 and are supported by the substrate-side bias electrode 11, via hinge support posts (first support posts) 39. Each mirror 51 is electrically connected to a corresponding one of the torsion hinge 35 via a corresponding one of the mirror support post 41 and is supported by the torsion hinge 35. Hereinafter, description will be sometimes made with regard to one mirror 51, instead of the plurality of mirrors 51, and with regard to portions and the like that correspond to that mirror 51. Therefore, the mirror 51 is electrically connected to the substrate-side bias electrode 11 via the mirror support post 41, the torsion hinge 35, the hinge arms 36 and 37, and the hinge support posts 39. A bias voltage is applied to the mirror 51 from the substrate-side bias electrode 11. Distal ends of the hinge arms 36 and 37 are provided with stoppers 361, 362, 371 and 372 capable of contacting the mirror 51 when the mirror 51 tilts and therefore preventing contact between the mirror 51 and the elevated address electrodes 32 and 33.

The substrate-side address electrodes 12 and 13 and the elevated address electrodes 32 and 33 of the mirror 51 constitute a driving element that drives the mirror 51 so that the mirror 51 tilts, by creating electrostatic force on the mirror 51. Concretely, when drive voltage is applied to the substrate-side address electrode 12 or 13 and the elevated address electrode 32 or 33, the mirror 51 is drawn and tilted toward the substrate-side address electrode 12 and the elevated address electrode 32 or toward the substrate-side address electrode 13 and the elevated address electrode 33 as shown in FIG. 3A or 3B. At this time, the torsion hinge 35 becomes twisted. Then, when the application of drive voltage to the substrate-side address electrode 12 or 13 and the elevated address electrode 32 or 33 is stopped to discontinue the attractive force to the mirror 51, the torsion hinge 35 delivers force that returns the mirror 51 to a posture parallel to the substrate 1.

In the electrooptical apparatus 100, for example, when the mirror 51 tilts to the side of the substrate-side address electrode 12 and the elevated address electrode 32 as shown in FIG. 3A, an on-state is assumed in which the light emitted from the light source unit 1002 is reflected toward the projection optical system 1004 by the mirror 51. On the other hand, when the mirror 51 tilts to the side of the substrate-side address electrode 13 and the elevated address electrode 33 as shown in FIG. 3B, an off-state is assumed in which the light emitted from the light source unit 1002 is reflected toward a light absorption apparatus 1005. During the off-state, light is not reflected toward the projection optical system 1004. Such driving is performed for each one of the mirrors 51, so that light emitted from the light source unit 1002 is modulated into image light by a plurality of mirrors 51 and then is projected from the projection optical system 1004 to display images.

Incidentally, flat platy yokes that face the substrate-side address electrodes 12 and 13 may be formed integrally with the torsion hinge 35, so that the mirror 51 can be driven by using electrostatic force that acts between the substrate-side address electrode 12 or 13 and a corresponding one of the yokes in addition to the electrostatic force created between the elevated address electrode 32 or 33 and the mirror 51.

Detailed Illustration of Construction of Electrooptical Apparatus 100

Figure 4A:
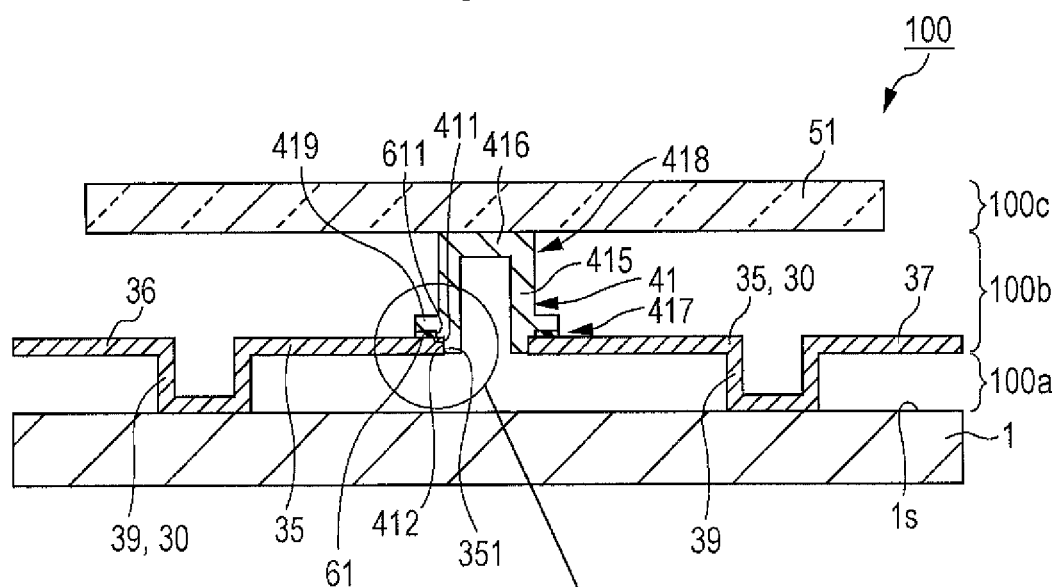
FIGS. 4A and 4B are detailed sectional views each showing a construction of an electrooptical apparatus according to the invention.
Figure 4B:
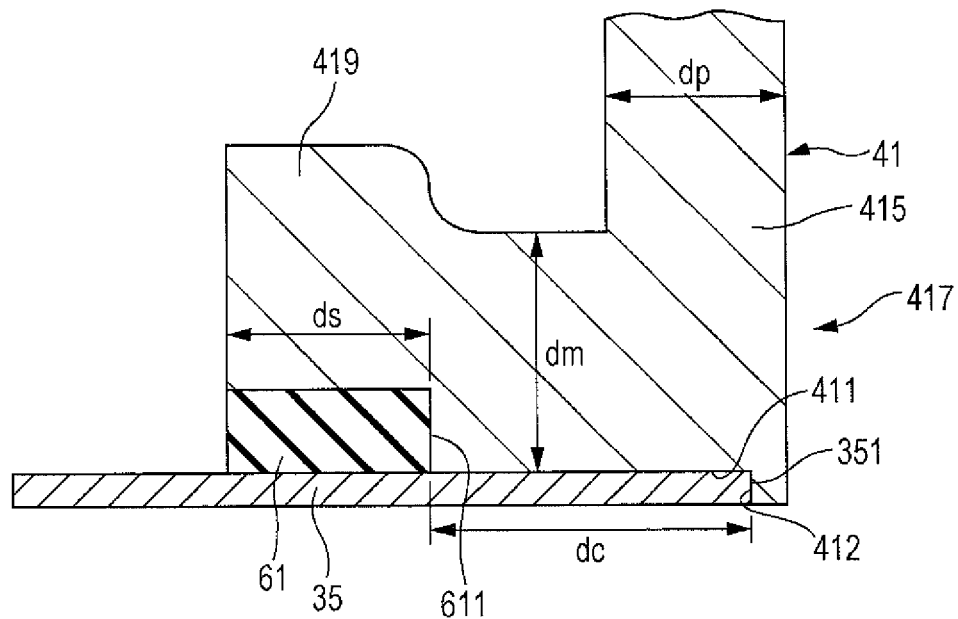

FIGS. 4A and 4B are detailed sectional views illustrating a construction of an electrooptical apparatus 100 according to the invention. FIG. 4A is a sectional view of the entire electrooptical apparatus 100. FIG. 4B is an enlarged sectional view of a connecting portion between a torsion hinge (twist hinge) and a mirror support post (second support post). Note that FIG. 4A shows only the second-tier portion 100b and the third-tier portion 100c of the electrooptical apparatus 100 and omits graphical illustration of the first-tier portion 100a that includes the substrate-side bias electrode 11, the substrate-side address electrodes 12 and 13, etc. although the reference numeral 100a is shown. Besides, FIG. 4A shows only one mirror 51, of the plurality of mirrors 51 formed in the electrooptical apparatus 100, and also shows the mirror support post 41 and the torsion hinge 35 that are provided for that mirror 51.

As shown in FIG. 4A, the electrooptical apparatus 100 has, at the one-side surface is side of the substrate 1, the electroconductive torsion hinge 35 that is supported by the substrate 1 via the electroconductive hinge support posts 39, and the torsion hinge 35 is provided with a first opening portion 351. In this exemplary embodiment, the hinge support posts 39 and the torsion hinge 35 are made of an integral metal layer. The hinge support posts 39 are protruded from the metal layer (first electroconductive film 30) toward the substrate 1. Furthermore, the electrooptical apparatus 100 includes a mirror support post 41 that has a tubular shape and that is protruded from the torsion hinge 35 toward a side opposite the substrate 1.

In the mirror support post 41, a first end portion 417 at the substrate 1 side has an open end whose opening faces the substrate 1. Besides, in the mirror support post 41, the substrate 1-side first end portion 417 has a first connecting portion 411 that, at the side opposite the substrate 1 side, lies over and in contact with a portion of the torsion hinge 35 extending along an edge of the first opening portion 351. Furthermore, the substrate 1-side first end portion 417 of the mirror support post 41 has a second connecting portion 412 that is in contact with an inner surface 351a of the first opening portion 351. Note that the mirror support post 41 has a tube portion 415 that extends from a torsion hinge 35 side toward the side opposite the substrate 1 (toward a mirror 51 side) and a flange portion 419 that extends outward from the substrate 1-side first end portion 417 of the tube portion 415. In this embodiment, a second end portion 418 of the mirror support post 41 that is the opposite side of the mirror support post 41 to the substrate 1 is a flat plate portion 416 that closes an opening end of the tube portion 415. The mirror 51 is in contact with the opposite side surface of the flat plate portion 416 to the substrate 1. Therefore, no dimple exists on the surface of the mirror 51.

In the electrooptical apparatus 100, an insulating intermediate layer 61 having a second opening portion 611 that is larger in diameter than the first opening portion 351 of the torsion hinge 35 is provided between the torsion hinge 35 and the mirror support post 41. At the first connecting portion 411 that is on an inner side of the second opening portion 611 of the intermediate layer 61, the first end portion 417 of the mirror support post 41 is in contact with the torsion hinge 35. In this exemplary embodiment, the intermediate layer 61 is formed only between the torsion hinge 35 and the mirror support post 41.

Note that a width ds of a portion of the intermediate layer 61 located between the torsion hinge 35 and the mirror support post 41, a thickness d of the thinnest portion of the first connecting portion 411 of the mirror support post 41, a distance dc from an inner peripheral surface of the first opening portion of the torsion hinge 35 to an inner peripheral surface of the second opening portion 611 of the intermediate layer 61, and a wall thickness dp of the tube portion 415 of the mirror support post 41 (see FIG. 4B) are, for example, ds=0.15 μm, dm=0.1 μm, dc=0.2 μm, and dp=0.3 μm. Thus, the width ds, the thickness dm, the distance dc, and the wall thickness dp have the following relationship:

$$dm < ds$$

$$ds < dc$$

$$dc < dp$$

Production Method for Electrooptical Apparatus

Of steps of production of the electrooptical apparatus 100 according to the invention, steps of forming torsion hinges (twist hinges), mirror support post (second support post), and mirrors will be centrally described with reference to FIG. 2B and FIGS. 5A to 5F to FIGS. 9A to 9D. FIGS. 5A to 5F, FIGS. 6A to 6E, and FIGS. 7A to 7D are sectional views illustrating a production method for the electrooptical apparatus 100 according to the invention. FIGS. 8A to 8F and FIGS. 9A to 9D are plan views of layers formed in production steps for the electrooptical apparatus 100 according to the invention. Note that although a plurality of mirrors 51 are formed in the electrooptical apparatus 100, FIGS. 5A to 9D show only one mirror 51 and a mirror support post 41 and a torsion hinge 35 that are provided for that mirror 51. Furthermore, in the following description, FIG. 2B is also referred to as appropriate to describe relations among various portions and sites.

Figure 5A:
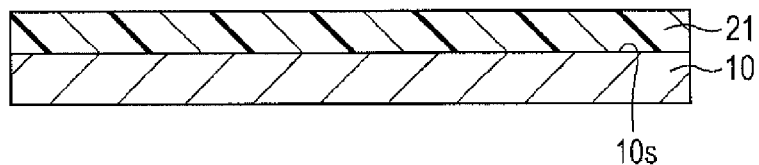
FIGS. 5A to 5F are sectional views illustrating steps of a production method for an electrooptical apparatus according to the invention.
Figure 5B:
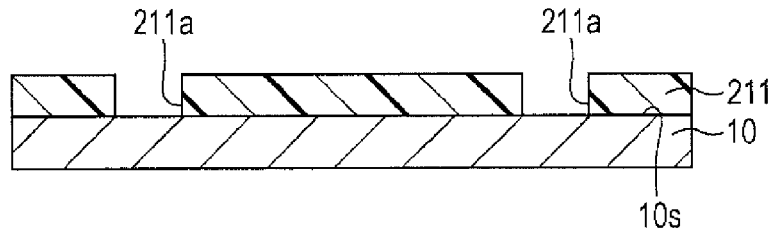

As shown in FIG. 5A, in step ST1, an address circuit 14, substrate-side address electrodes 12 and 13, etc. as described above with reference to FIG. 2B are formed on a wafer 10 (substrate) made of a silicon substrate.

Figure 8A:
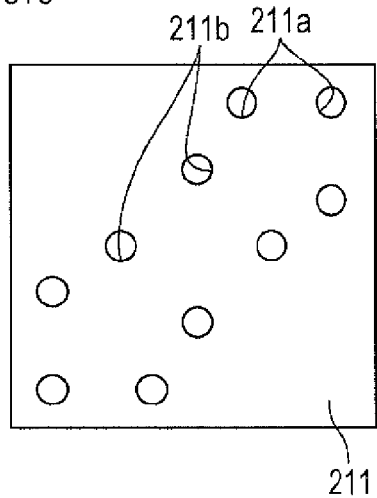
FIGS. 8A to 8F are plan views of layers formed in production steps of an electrooptical apparatus according to the invention.

Next, in step ST2, a photosensitive resist layer 21 made of a positive-type organic photoresist or the like is formed on a one-side surface 10s of the wafer 10. Then, in step ST3 shown in FIG. 5B, the photosensitive resist layer 21 is exposed to light ("exposed to light" is sometimes expressed simply as "exposed" in this specification) and developed to form a first sacrificial layer 211 that has hinge support post-dedicated opening portions (first support post-dedicated opening portions) 211a. At that time, electrode post-dedicated opening portions 211b for the electrode posts 321 and 331 of the elevated address electrodes 32 and 33 are also formed as shown in FIG. 8A. The first sacrificial layer 211 has a thickness of, for example, 1 μm, and the hinge support post-dedicated opening portions 211a have an opening diameter of, for example, about 0.6 μm. These steps ST2 and ST3 constitute a first sacrificial layer-forming step.

Figure 5C:
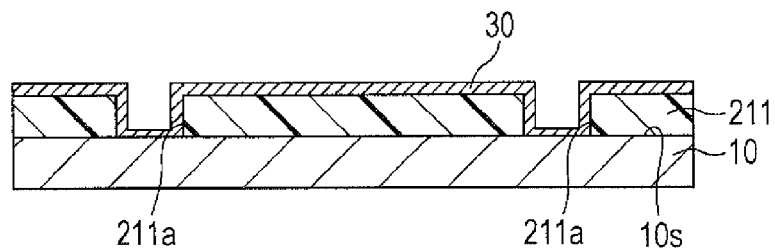
Figure 8B:
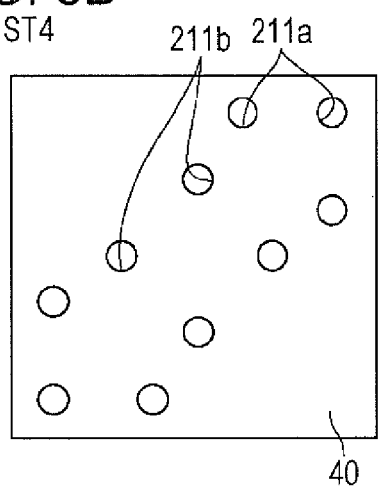

Next, in step ST4 (first electroconductive film-forming step) shown in FIG. 5C, a first electroconductive film 30 is formed entirely over the surface of the first sacrificial layer 211 (the opposite side surface thereof to the wafer 10) (see FIG. 8B). At this time, the first electroconductive film 30 is formed also on wall surfaces and bottom surfaces of the hinge support post-dedicated opening portions 211a. The first electroconductive film 30 is, for example, a single film of an aluminum layer or a laminate film of an aluminum layer and a titanium layer, and has a thickness of, for example, 0.06 µm.

Figure 5D:
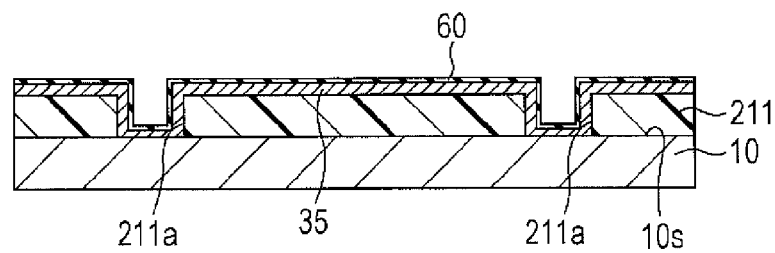
Figure 8C:
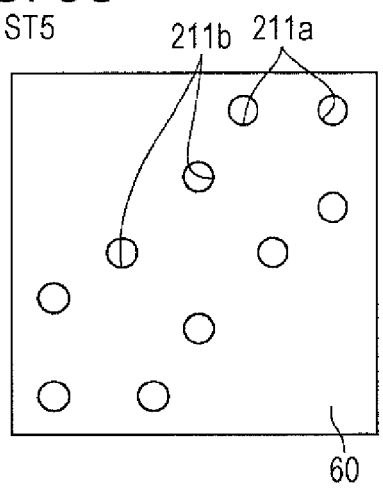
Figure 8D:
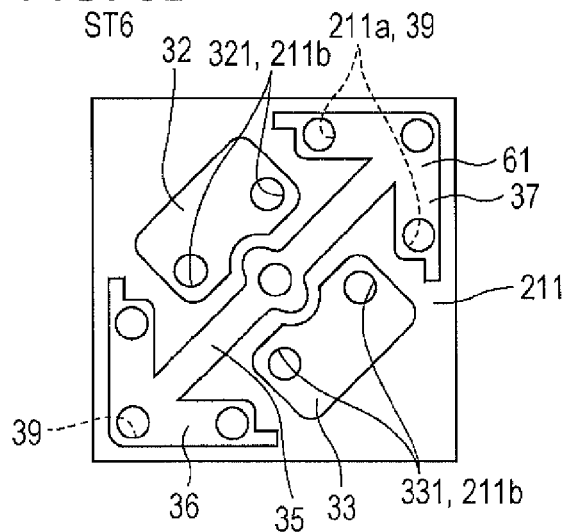

Next, in step ST5 shown in FIG. 5D, an insulation film 60, such as a silicon oxide film (SiO$_2$), is formed using a PECVD (plasma-enhanced chemical vapor deposition) method or the like (see FIG. 8C). The insulation film 60 has a thickness of, for example, 0.15 µm.

Figure 5E:
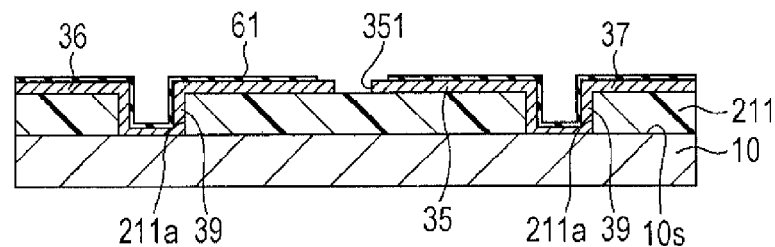

Next, in the step ST6 (first patterning step) shown in FIG. 5E, after a resist mask is formed on a surface of the insulation film 60 (the opposite surface thereof to the wafer 10), the insulation film 60 is patterned so that the insulating intermediate layer 61 identical in planar shape to the torsion hinge 35 is formed as an etching mask layer. After that, the resist mask is removed. Next, using the intermediate layer 61 as a mask, the first electroconductive film 30 is patterned to form the torsion hinge 35. At that time, the first electroconductive film 30 remaining in the hinge support post-dedicated opening portions 211$a$ forms hinge support posts 39 integrally with the torsion hinge 35. The torsion hinge 35 is provided with a first opening portion 351. At that time, hinge arms 36 and 37 are formed as shown in FIG. 82. Furthermore, elevated address electrodes 32 and 33 are simultaneously formed and electrode posts 321 and 331 are formed within the electrode post-dedicated opening portions 211$b$. The first opening portion 351 has an inside diameter of, for example, 0.5 µm.

Figure 5F:
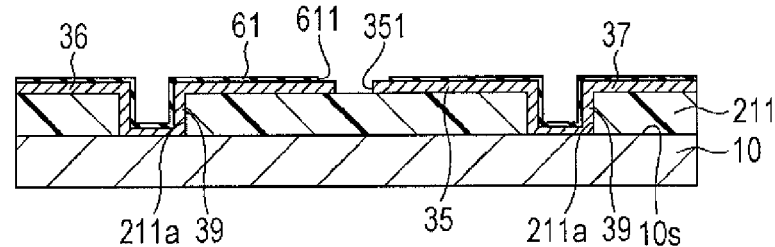
Figure 8E:
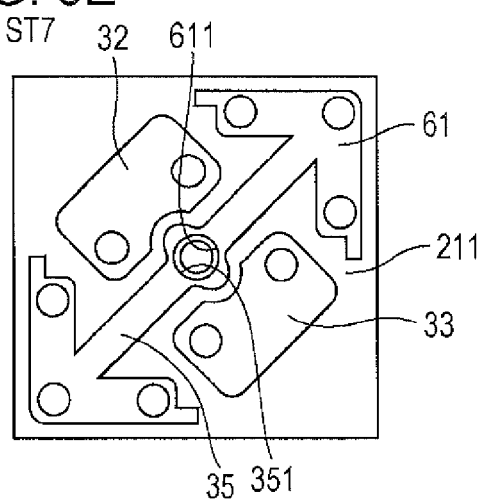
Figure 8F:
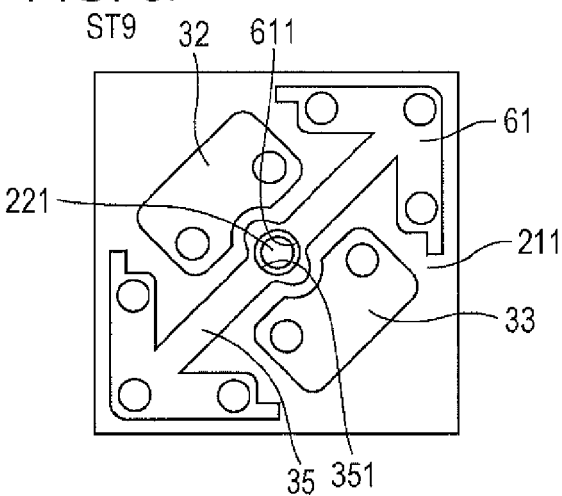

Next, in step ST7 shown in FIG. 5F, after a resist mask is formed on the surface of the intermediate layer 61 (the opposite surface thereof to the wafer 10), the intermediate layer 61 is patterned to form a second opening portion 611 through which a portion of the torsion hinge 35, more specifically, a portion extending along the edge of the first opening portion 351, is bare (see FIG. 8E). The inside diameter of the second opening portion 611 is, for example, 0.8 µm, and is larger than that of the first opening portion 351 of the torsion hinge 35. After that, the resist mask is removed.

Next, in step ST8 shown in FIG. 6A, a photosensitive resist layer 22 made of a positive-type organic photoresist or the like is formed on the opposite side of the torsion hinge 35 to the wafer 10. Then, in step ST9 shown in FIG. 6B, the photosensitive resist layer 22 is exposed to light and developed so that a columnar second sacrificial layer 221 protruded from a torsion hinge 35 side toward the side opposite the wafer 10 is formed at a location coinciding with the first opening portion 351 (see FIG. 8F). The second sacrificial layer 221 has a thickness (height) of, for example, 2 µm, and an outside diameter of, for example, 0.4 µm. These steps ST8 and ST9 constitute a second sacrificial layer-forming step.

Next, in step ST10 (second electroconductive film-forming step) shown in FIG. 6C, a second electroconductive film 40 is formed so as to cover the opposite side of the torsion hinge 35 to the wafer 10 and have a tube portion 415 and a flat plate portion 416. The tube portion 415 covers a side surface of the columnar second sacrificial layer 221 and the flat plate portion 416 covers an opposite end surface of the columnar second sacrificial layer 221 to the wafer 10. The second electroconductive film 40 can be formed so that the thickness of the second electroconductive film 40 on the side surface of the columnar second sacrificial layer 221 is larger than the thickness of the second electroconductive film 40 formed on the opposite side surface of the torsion hinge 35 to the wafer 10, by, for example, performing sputtering from a direction oblique to the direction of the normal to the substrate (water 10) while turning the substrate. Concretely, the second electroconductive film 40 is made of an aluminum film whose thickness is 0.3 µm on the side surface of the columnar second sacrificial layer 221 and 0.15 µm on the opposite side surface of the torsion hinge 35 to the wafer 10.

Figure 9A:
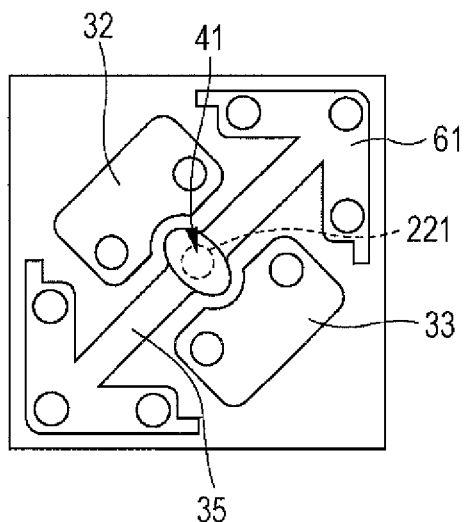
FIGS. 9A to 9D are plan views of layers formed in production steps of an electrooptical apparatus according to the invention.
Figure 9C:
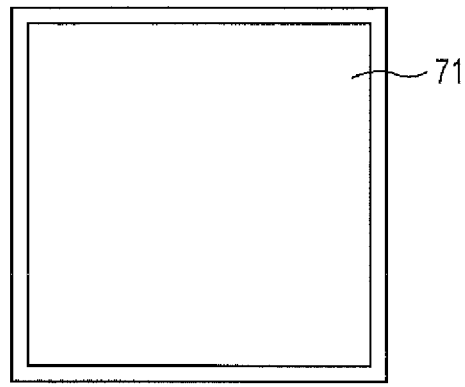

Next, in step ST11 (second patterning step) shown in FIG. 6D, after a resist mask is formed on the surface of the second electroconductive film 40 (the opposite side surface thereof to the wafer 10), the second electroconductive film 40 is patterned to form a mirror support post 41 that covers the second sacrificial layer 221 and that has a first connecting portion 411 around the second sacrificial layer 221 (see FIG. 9A). The first connecting portion 411 contacts a portion of the torsion hinge 35 which extends around the second sacrificial layer 221, from the side opposite the wafer 10. At that time, the mirror support post 41 is provided also with a second connecting portion 412 that contacts the inner peripheral surface of the first opening portion 351 of the torsion hinge 35.

Next, in step ST12 (third sacrificial layer-forming step) shown in FIG. 6E, a photosensitive resist layer made of a positive-type organic photoresist or the like is formed so as to cover the torsion hinge 35 and the mirror support post 41 from the side opposite the wafer 10 and then is hardened to form a third sacrificial layer 231. The third sacrificial layer 231 has a thickness of, for example, 3 µm.

Figure 7A:
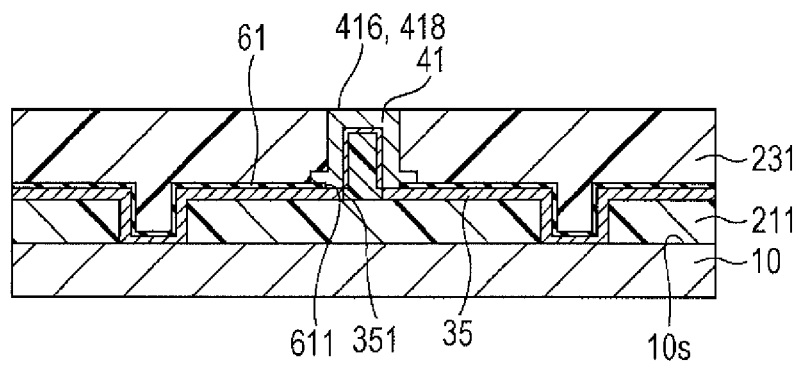
FIGS. 7A to 7D are sectional views illustrating steps of a production method for an electrooptical apparatus according to the invention.
Figure 9B:
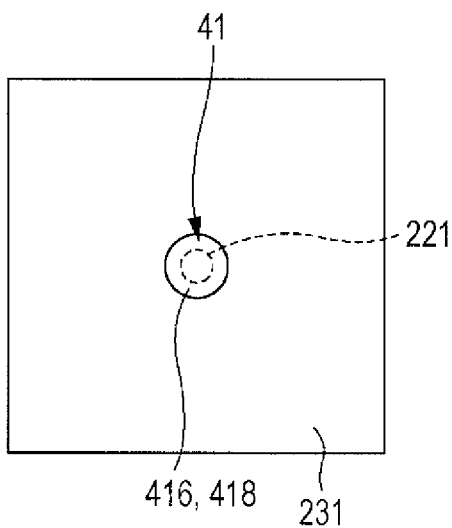
Figure 9D:
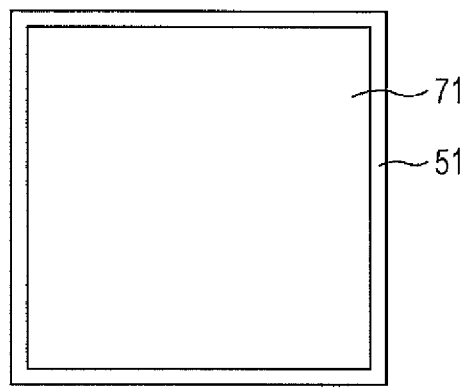

Next, in step ST13 (planarizing step) shown in FIG. 7A, using a CMP (chemical mechanical planarization) method or the like, the third sacrificial layer 231 is planarized from the side opposite the wafer 10 so that the second end portion 418 of the mirror support post 41 becomes bare (see FIG. 9B). In this exemplary embodiment, the planarization is performed so that the flat plate portion 416 remains on the second end portion 418 of the mirror support post 41.

Figure 7B:
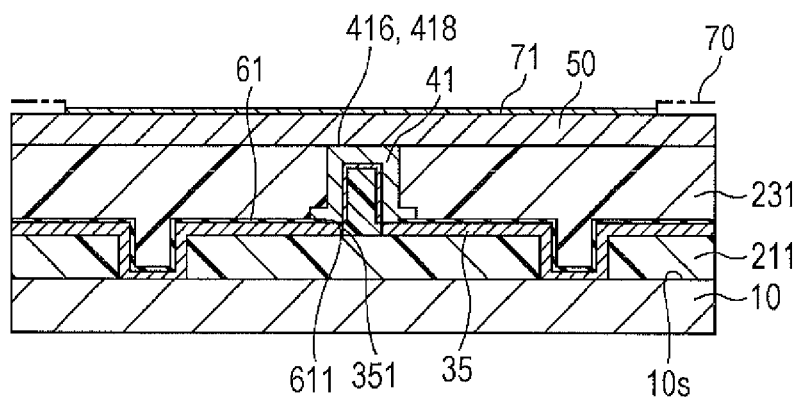

Next, in step ST14 (third electroconductive film-forming step) shown in FIG. 7B, a third electroconductive film 50 is formed on the opposite side of the third sacrificial layer 231 to the wafer 10. The third electroconductive film 50 is, for example, an aluminum layer whose thickness is 0.3 µm.

Next, an inorganic film 70, such as a silicon oxide film (SiO$_2$), is formed on the third electroconductive film 50 by the PECVD method or the like. Then, in step ST15, a resist mask is formed on the surface of the inorganic film 70 (the opposite side surface thereof to the wafer 10) and the inorganic film 70 is patterned to form an etching stopper layer 71 that is identical in planar shape to the mirror 51 (see FIG. 9C). After that, the resist mask is removed. Next, in step ST16 shown in FIG. 7C, using the etching stopper layer 71 as a mask, the third electroconductive film 50 is patterned to form mirrors 51 (see FIG. 9D). These steps ST14, ST15 and ST16 constitute a third patterning step.

Figure 7C:
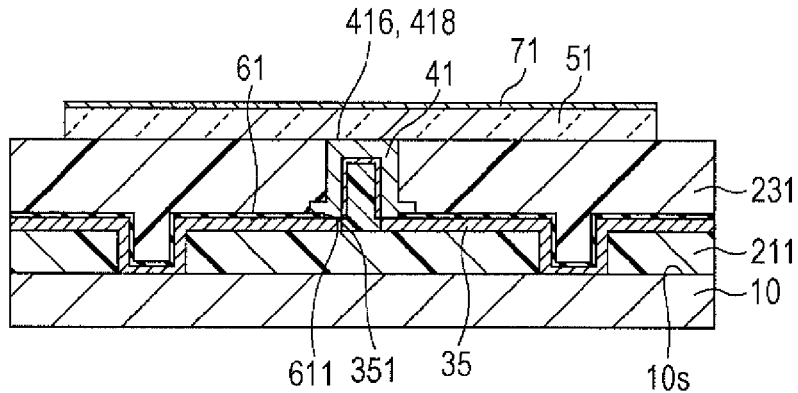

Next, in step ST17 shown in FIG. 7C, the wafer 10 is divided into a plurality of substrates 1 of a single-item size.

Figure 7D:
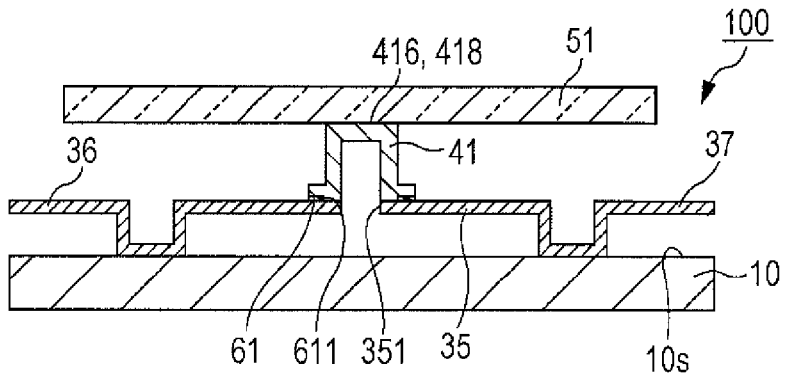

Next, in step ST18 (sacrificial layer-removing step) shown in FIG. 7D, plasma etching or the like is performed to remove the first sacrificial layer 211, the second sacrificial layer 221, and the third sacrificial layer 231. Specifically, because the first sacrificial layer 211 and the second sacrificial layer 221 are in contact with each other between the mirror support post 41 and the wafer 10, the removal of the first sacrificial layer 211 is followed by the removal of the second sacrificial layer 221. In this exemplary embodiment, when the first sacrificial layer 211, the second sacrificial layer 221, and the third sacrificial layer 231 are removed, the etching stopper layer 71 is removed. Furthermore, in this exemplary embodiment, when the first sacrificial layer 211, the second sacrificial layer 221, and the third sacrificial layer 231 are removed, a portion of the intermediate layer 61 which is bare and not covered with the mirror support post 41 is removed. Therefore, the intermediate layer 61 remains only between the mirror support post 41 and the torsion hinge 35. As a result, the electrooptical apparatus 100 is obtained.

Main Advantageous Effects of the Exemplary Embodiment

As described above, in this exemplary embodiment, the mirror support post 41 protruded from the torsion hinge 35 to the side opposite the substrate 1 has a tubular shape, and the substrate 1-side first end portion 417 of the mirror support post 41 has an open end. Besides, the torsion hinge 35 is provided with the first opening portion 351. Therefore, even if when a mirror support post 41 is formed a sacrificial layer exists inside, the sacrificial layer can be removed. Hence, the resin that forms the sacrificial layer does not remain within the mirror support post 41, so that even when the temperature of the electrooptical apparatus 100 rises due to emitted light or due to heat generation of the substrate or the like at the time of operation of the drive circuit, production of gas from a sacrificial layer does not occur. Consequently, an event in which gas produced from a sacrificial layer decreases the reflectance of the surface of a mirror 51 (reflecting surface thereof) will not occur.

Furthermore, on the opposite side of the mirror support post 41 to the substrate 1, a mirror 51 separate from the mirror support post 41 is connected to the second end portion 418 that is provided with the flat plate portion 416. Therefore, no dimple is formed on the surfaces of the mirrors 51. Hence, light utilization efficiency can be improved and the decrease in contrast level due to the scattering by a mirror 51 can be restrained.

Furthermore, since the mirror support post 41 and the torsion hinge 35 are in surface contact with each other at the first connecting portion 411, the mirror support post 41 and torsion hinge 35 can be certainly electrically connected.

Modifications of Exemplary Embodiments

In the foregoing exemplary embodiments, the width s, the thickness dm, the wall thickness dp, and the distance dc mentioned above have the following relationship:

$$dm<ds$$

$$ds<dc$$

$$dc<dp$$

However, it is preferable that the width ds, the thickness dm, and the distance do satisfy the following relationship:

$$dm<ds<dc$$

According to this configuration, the mirror support post 41 has, at a lower layer side, a large contact area, so that the mirror support post 41 has a sufficient strength.

Furthermore, it is preferable that the wall thickness dp, the width ds, and the distance do satisfy the following relationship:

$$ds<dp$$

and $$dc<dp$$

According to this configuration, the overlaps of the intermediate layer 61 and the mirror support post 41 with the torsion hinge 35 are small in width, so that deterioration of the performance of the torsion hinge 35 can be restrained.

Although in the foregoing exemplary embodiments, the distance do is 0.2 μm, the distance do may be reduced, for example, to 0.1 μm, so that even if the first opening portions 351 of the torsion hinge 35 vary in position, the first sacrificial layer 211 and the second sacrificial layer 221 will certainly contact each other via the first opening portions 351. Therefore, in the step ST18 (sacrificial layer-removing step), the second sacrificial layer 221 can be certainly removed, and the second sacrificial layer 221 can be certainly prevented from remaining inside the mirror support post 41.

Although in the foregoing exemplary embodiments, the step ST13 (planarizing step) shown in FIG. 7A performs planarization so that the flat plate portion 416 remains on the second end portion 418 of each mirror support post 41, planarization may be performed until the flat plate portions 416 are removed. In such a case, too, when the third electroconductive film 50 for forming the mirrors 51 is to be formed, the end portion of each mirror support post 41 is provided as a flat portion that is formed by the second sacrificial layer 221. Therefore, no dimple is formed on the surfaces of the mirrors 51.

What is claimed is:

1. An electrooptical apparatus comprising:
    a substrate;
    a metal layer that is provided above the substrate and includes a torsion hinge having a first opening portion and a pair of first support posts protruding from the torsion hinge toward the substrate to support the torsion hinge;
    a second support post that protrudes from the torsion hinge toward a side opposite to the substrate and has a tubular shape, the second support post having a first end portion at a side to the substrate and a second end portion at a side opposite to the substrate, the first end portion having:
        an open end;
        a first connecting portion connected around the first opening portion; and
        a second connecting portion connected to an inner surface of the first opening portion; and
    a mirror that is provided above the second end portion of the second support post.

2. The electrooptical apparatus according to claim 1, further comprising
    an insulating intermediate layer that is provided between the torsion hinge and the second support post and that has a second opening portion inside which the first connecting portion is located.

3. The electrooptical apparatus according to claim 2, wherein
    a thickness of a thinnest portion of the first connecting portion is represented by dm, and
    a distance from an inner peripheral surface of the first opening portion of the torsion hinge to an inner peripheral surface of the second opening portion of the intermediate layer is represented by dc,
    the thickness dm and the distance dc satisfy a relationship as follows:

$$dm<dc.$$

4. An electronic appliance comprising:
    the electrooptical apparatus according to claim 3; and
    a light source that emits light source light to the mirror.

5. The electrooptical apparatus according to claim 2, wherein a width of a portion of the intermediate layer which is located between the torsion hinge and the second support post is represented by ds, a thickness of a thinnest portion of the first connecting portion is represented by dm, and a distance from an inner peripheral surface of the first opening portion of the torsion hinge to an inner peripheral surface of the second opening portion of the intermediate layer is represented by dc, the width ds, the thickness dm, and the distance dc satisfy a relationship as follows:

$$dm<ds<dc.$$

6. An electronic appliance comprising:

the electrooptical apparatus according to claim 5; and a light source that emits light source light to the mirror.

7. The electrooptical apparatus according to claim 2, wherein a wall thickness of a tube portion of the second support post which extends from the torsion hinge toward the mirror is represented by dp, a width of a portion of the intermediate layer which is located between the torsion hinge and the second support post is represented by ds, and a distance from an inner peripheral surface of the first opening portion of the torsion hinge to an inner peripheral surface of the second opening portion of the intermediate layer is represented by dc, the wall thickness dp, the width ds, and the distance dc satisfy a relationship as follows:

$$ds<dp$$

and $$dc<dp.$$

8. An electronic appliance comprising:

the electrooptical apparatus according to claim 7; and a light source that emits light source light to the mirror.

9. An electronic appliance comprising:

the electrooptical apparatus according to claim 2; and a light source that emits light source light to the mirror.

10. An electronic appliance comprising:

the electrooptical apparatus according to claim 1; and a light source that emits light source light to the mirror.

\* \* \* \* \*